United States Patent [19]
Davenport

[11] Patent Number: 6,124,734
[45] Date of Patent: Sep. 26, 2000

[54] HIGH-SPEED PUSH-PULL OUTPUT STAGE FOR LOGIC CIRCUITS

[75] Inventor: William H. Davenport, Hillsboro, Oreg.

[73] Assignee: TriQuint Semiconductor, Inc., Hillsboro, Oreg.

[21] Appl. No.: 09/197,486

[22] Filed: Nov. 20, 1998

[51] Int. Cl.[7] .................... H03K 19/0175; H03K 19/01; H03K 5/12
[52] U.S. Cl. ............................. 326/83; 326/17; 326/89; 327/170
[58] Field of Search .................................. 326/17, 82–83, 326/86, 89–90, 112, 119, 121, 124, 128; 327/112, 374, 170

[56] References Cited

U.S. PATENT DOCUMENTS

| | | | |
|---|---|---|---|
| 4,918,336 | 4/1990 | Graham et al. | 326/117 |
| 5,218,239 | 6/1993 | Boomer | 326/27 |
| 5,367,210 | 11/1994 | Lipp | 326/26 |
| 5,633,600 | 5/1997 | Ohnishi | 326/17 |
| 5,818,278 | 10/1998 | Yamamoto et al. | 327/333 |
| 5,821,783 | 10/1998 | Torimaru et al. | 327/108 |
| 6,051,995 | 4/2000 | Pollachek | 326/87 |

FOREIGN PATENT DOCUMENTS

| | | | |
|---|---|---|---|
| 0 810 734 | 12/1997 | European Pat. Off. | H03K 19/094 |
| 63-240214 | 10/1988 | Japan | H03K 19/094 |
| 1-175319 | 7/1989 | Japan | H03K 19/094 |

*Primary Examiner*—Michael Tokar
*Assistant Examiner*—James H. Cho
*Attorney, Agent, or Firm*—Skjerven Morrill MacPherson LLP; Brian D. Ogonowsky; Daniel P. Stewart

[57] ABSTRACT

A logic circuit output stage includes a first transistor with a first terminal that receives the first logic output signal and a third terminal coupled to a first output node. A second transistor has a first terminal coupled to the first terminal of the first transistor. A third transistor has a first terminal that receives the second logic output signal and a third terminal coupled to a second output node. A fourth transistor has a first terminal coupled to a third terminal of the second transistor and a second terminal coupled to the second output node. An impedance is connected between the third terminal of the second transistor and the first output node. In this output stage, the second transistor provides a transient signal to the first terminal of the fourth transistor in response to a transition in the first logic output signal. The fourth transistor provides a temporary change in the current flowing through the second output node in response to the transient signal received from the second transistor. The temporary current change provided by the fourth transistor allows faster charging or discharging of capacitive loads on the second output node, thereby producing a faster output slew rate. Moreover, the faster output slew rate is produced without significantly increasing either the integrate circuit chip area or the power consumed by the output stage.

20 Claims, 2 Drawing Sheets

HIGH-SPEED PUSH-PULL OUTPUT STAGE FOR LOGIC CIRCUITS

TECHNICAL FIELD OF THE INVENTION

The present invention relates to digital logic circuits, and in particular to a high-speed push-pull output stage for logic circuits.

BACKGROUND OF THE INVENTION

As is well known in the art of logic circuit design, emitter-coupled logic (ECL), used as a design format for some logic circuits utilizing bipolar transistors, has a counterpart known as source-coupled FET logic (SCFL), which utilizes field effect transistors. In SCFL circuits, several different voltage level outputs are commonly generated for use in subsequent logic circuits. In high-speed SCFL circuits, as in many other high-speed logic circuits, the ability to drive output signals to their nominal levels within the shortest possible time period under a variety of load conditions is important.

For this reason, push-pull output stages have been developed, in which a transitioning output signal is simultaneously used to open one transistor conduction path between the load and a first reference voltage, such as a supply voltage $V_{DD}$, and to close another transistor conduction path between the load and a second reference voltage, such as ground. While conventional push-pull output stages have increased output slew rates of SCFL circuits, further improvement in output slew rate is desirable, particularly under heavy load conditions, without increasing the power dissipation of the circuit.

SUMMARY OF THE INVENTION

Therefore, a need has arisen for a logic circuit output stage that addresses the disadvantages and deficiencies of the prior art. In particular, a need has arisen for a more efficient logic circuit output stage with a high output slew rate, even under heavy load conditions.

Accordingly, a logic circuit output stage is disclosed. In one embodiment, the logic circuit output stage includes a first transistor with a first terminal that receives the first logic output signal and a third terminal coupled to a first output node. A second transistor has a first terminal coupled to the first terminal of the first transistor. A third transistor has a first terminal that receives the second logic output signal and a third terminal coupled to a second output node. A fourth transistor has a first terminal coupled to a third terminal of the second transistor and a second terminal coupled to the second output node. An impedance is connected between the third terminal of the second transistor and the first output node. In this output stage, the second transistor provides a transient signal to the first terminal of the fourth transistor in response to a transition in the first logic output signal. The fourth transistor provides a temporary change in the current flowing through the second output node in response to the transient signal received from the second transistor.

An advantage of the present invention is that the temporary current change provided by the fourth transistor allows faster charging or discharging of capacitive loads on the second output node, thereby producing a faster output slew rate. Another advantage of the present invention is that the faster output slew rate is produced without significantly increasing either the integrate circuit chip area or the power consumed by the output stage.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

Figure 1:
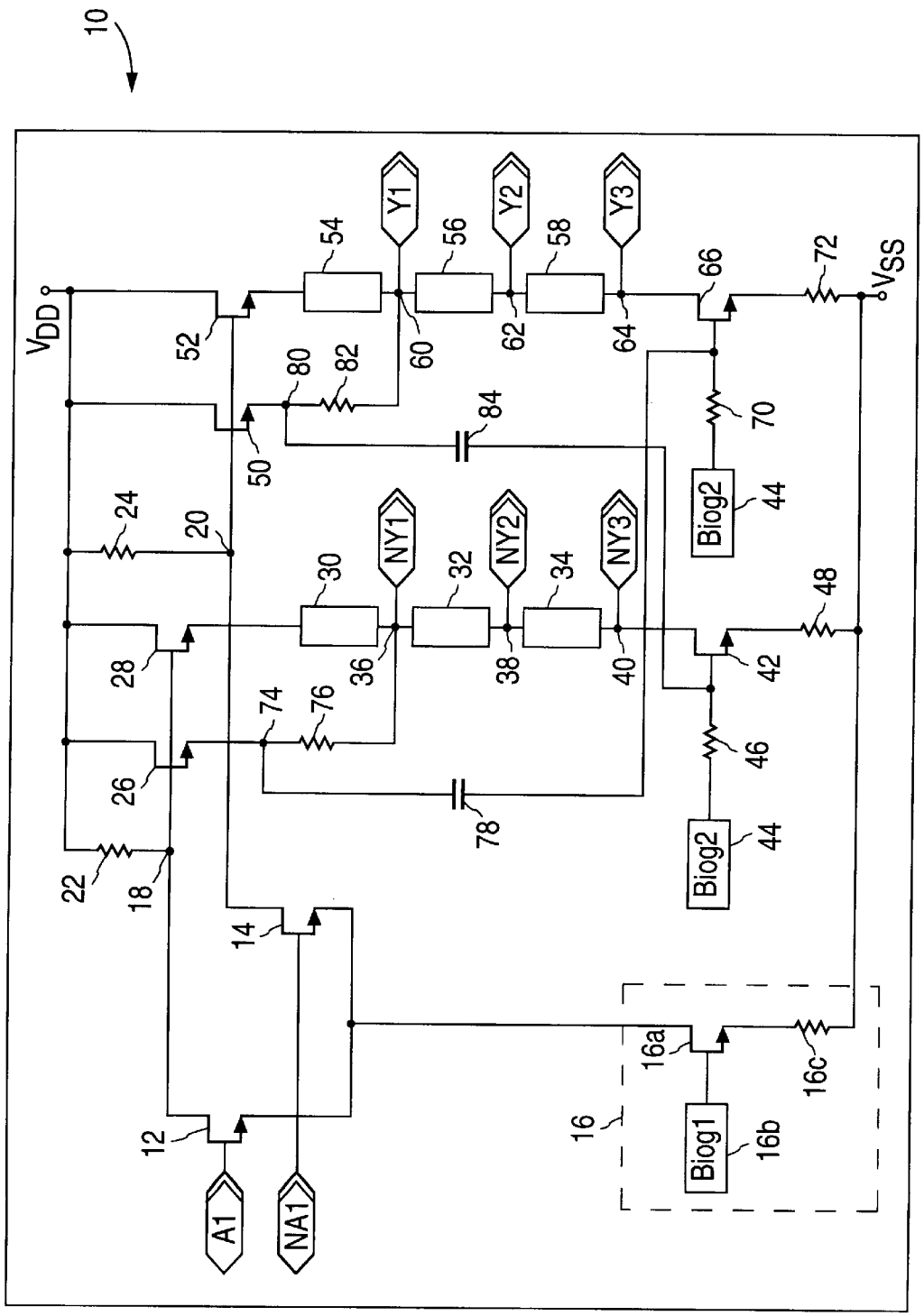
FIG. 1 is a schematic diagram of a logic circuit output stage constructed in accordance with the present invention.
Figure 2:
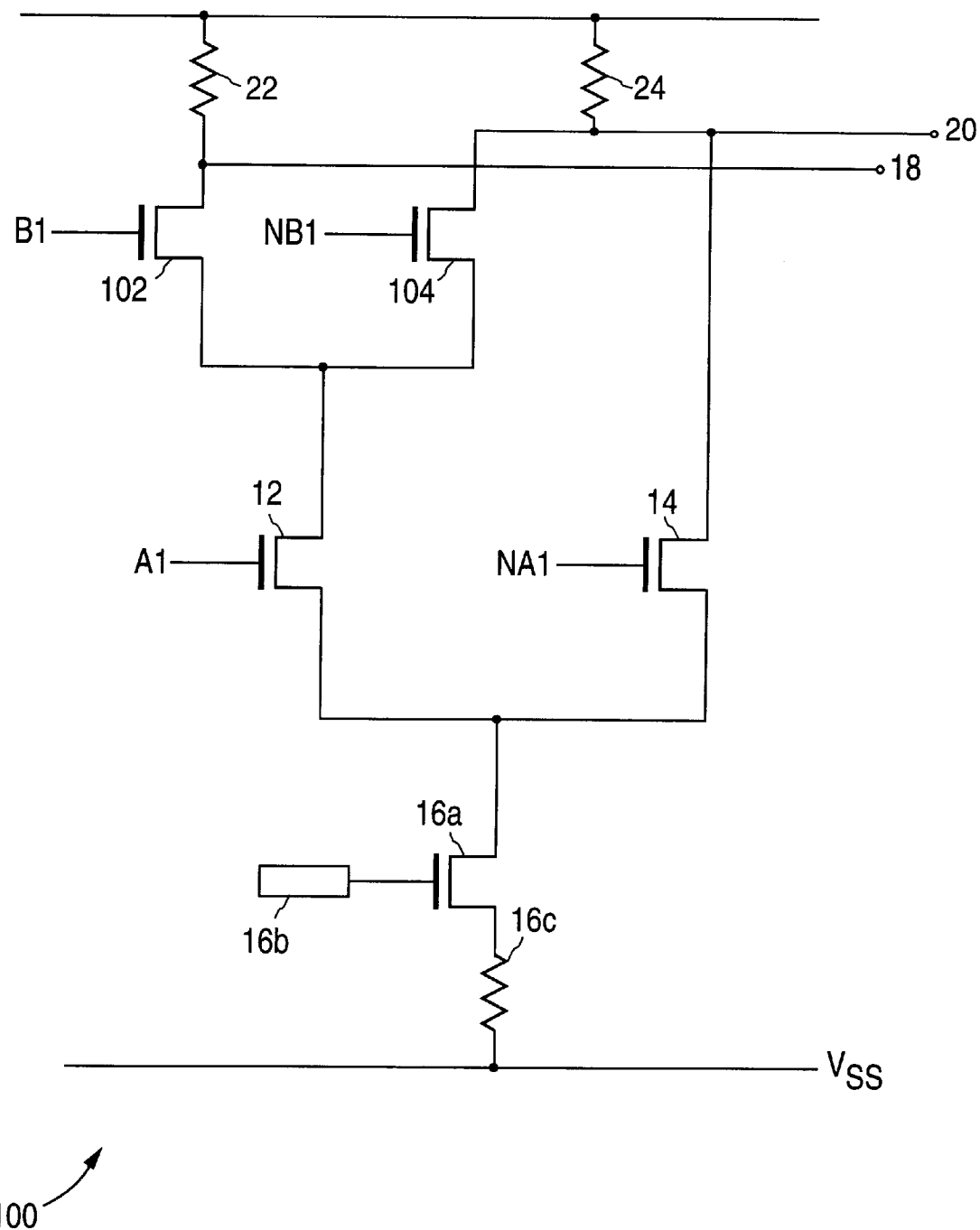
FIG. 2 is a schematic diagram of a portion of a logic circuit utilizing the output stage.

The preferred embodiments of the present invention and their advantages are best understood by referring to FIGS. 1 and 2 of the drawings. Like numerals are used for like and corresponding parts of the various drawings.

Referring to FIG. 1, a schematic diagram of a SCFL output stage 10 is shown. Output stage 10 may be used as an output buffer for a logic circuit. Alternatively, output stage 10 may form an integral part of an SCFL logic circuit, as will be described more fully below.

In one embodiment, output stage 10 receives a logic-level signal A1 at the gate of a first transistor 12 and a complementary logic-level signal NA1 at the gate of a second transistor 14, which is preferably matched with transistor 12. Both transistors 12 and 14 are n-channel field effect transistors. The sources of transistors 12 and 14 are coupled to a current source 16, which includes a transistor 16a, a bias voltage source 16b supplying a bias voltage to the gate of transistor 16a, and a resistor 16c connected between the source of transistor 16a and a reference voltage $V_{SS}$. The drains of transistors 12 and 14 are connected to nodes 18 and 20, respectively.

Matched resistors 22 and 24 are connected between a reference voltage $V_{DD}$ and nodes 18 and 20, respectively. Thus, when signal A1 is HIGH, substantially the entire current flowing through current source 16 flows through transistor 12 and resistor 22, bringing node 18 to a low voltage approximately equal to $V_{DD}-I(16)*R(22)$, where I(16) is the current through current source 16 and R(22) is the resistance of resistor 22. In this state, signal NA1 is LOW, so that no current or very little current flows through transistor 14 and resistor 24, bringing node 20 to a high voltage near $V_{DD}$. Similarly, when signal A1 is LOW and signal NA1 is HIGH, node 18 has a high voltage near $V_{DD}$, while node 20 has a low voltage approximately equal to $V_{DD}-I(16)*R(24)$, where R(24) is the resistance of resistor 24.

Node 18 is connected to the gates of two n-channel transistors 26 and 28, each having a drain connected to reference voltage $V_{DD}$. Transistors 26 and 28 act as source-followers.

Transistor 28 has a source connected to a series of impedances 30, 32 and 34. Impedance 30 is connected between the source of transistor 28 and an output node 36. Impedance 32 is connected between output node 36 and a second output node 38. Impedance 34 is connected between output node 38 and a third output node 40.

In one embodiment, impedances 30, 32 and 34 are diodes. Thus, for either a high or low output signal, output node 38 is one diode drop below output node 36, and output node 40 is one diode drop below output node 38. One or more of these three output voltage levels may be used for subsequent SCFL logic stages, in accordance with well known SCFL design practices.

Output node 40 is connected to the drain of an n-channel transistor 42. A bias voltage source 44 is connected to the gate of transistor 42 via a resistor 46. Another resistor 48 is connected between the source of transistor 42 and reference voltage $V_{SS}$. In the steady state where output nodes 36, 38 and 40 are either HIGH or LOW, transistor 42 acts as a current source, conducting current away from output node 40. The operation of transistor 42 during a state transition will be described below.

Node 20, like node 18, is connected to the gates of two n-channel transistors 50 and 52, each having a drain connected to reference voltage $V_{DD}$. Transistors 50 and 52 act as source-followers.

Transistor 52 has a source connected to a series of impedances 54, 56 and 58. Impedance 54 is connected between the source of transistor 52 and an output node 60. Impedance 56 is connected between output node 60 and a second output node 62. Impedance 58 is connected between output node 62 and a third output node 64.

In one embodiment, impedances 54, 56 and 58 are diodes. Thus, for either a high or low output signal, output node 62 is one diode drop below output node 60, and output node 64 is one diode drop below output node 62. One or more of these three output voltage levels may be used for subsequent SCFL logic stages, in accordance with well known SCFL design practices.

Output node 64 is connected to the drain of an n-channel transistor 66. Bias voltage source 44 is connected to the gate of transistor 66 via a resistor 70. Another resistor 72 is connected between the source of transistor 66 and reference voltage $V_{SS}$. In the steady state where output nodes 60, 62 and 64 are either HIGH or LOW, transistor 66 acts as a current source, conducting current away from output node 64. The operation of transistor 66 during a state transition will be described below.

The source of transistor 26 is connected to a node 74. A large resistor 76 is connected between node 74 and output node 36. A capacitor 78 is connected between node 74 and the gate of transistor 66. Similarly, the source of transistor 50 is connected to a node 80. A large resistor 82 is connected between node 80 and output node 60. A capacitor 84 is connected between node 80 and the gate of transistor 42.

During a signal transition in which signal A1 transitions from LOW to HIGH and signal NA1 transitions from HIGH to LOW, transistor 12 turns on, reducing the voltage on node 18. As a result, output nodes 36, 38 and 40 are brought LOW. Meanwhile, transistor 14 turns off, increasing the voltage on node 20. As a result, the voltage on node 80 increases. This transient positive voltage swing is transmitted by capacitor 84 to the gate of transistor 42, thereby temporarily increasing the current flow through transistor 42. This temporary increase in current flow through transistor 42 allows capacitive loads on output nodes 36, 38 and 40 to be discharged more rapidly during the transition of output nodes 36, 38 and 40 from HIGH to LOW than would be possible if a constant bias voltage were maintained at the gate of transistor 42.

At the same time, the voltage increase at node 20 causes output nodes 60, 62 and 64 to transition from LOW to HIGH. During this transition, the voltage decrease at node 18 causes a corresponding voltage decrease at node 74. This transient downward voltage swing at node 74 is transmitted by capacitor 78 to the gate of transistor 66, thereby temporarily decreasing the current flow through transistor 66. This temporary decrease in current flow through transistor 66 results in temporarily greater current flow to output nodes 60, 62 and 64 during the transition of output nodes 60, 62 and 64 from LOW to HIGH than would be possible if a constant bias voltage were maintained at the gate of transistor 66. Thus, capacitive loads on output nodes 60, 62 and 64 may be charged more rapidly than would otherwise be possible.

During a signal transition in which signal A1 transitions from HIGH to LOW and signal NA1 transitions from LOW to HIGH, the above-described phenomena are repeated in the opposite directions, allowing capacitive loads on output nodes 36, 38 and 40 to be charged more rapidly, and loads on output nodes 60, 62 and 64 to be discharged more rapidly, than would otherwise be possible. Transistors 26 and 50 and capacitors 78 and 84 therefore enable output stage 10 to achieve a greater output slew rate than would otherwise be possible for a given power dissipation.

In one embodiment, transistors 26 and 50 each have a width W, while transistors 28 and 52 each have a width 3W. Thus, the increased slew rate achieved by output stage 10 could be approximated by eliminating transistors 26 and 50 and resistors 76 and 82, increasing the width of transistors 28 and 52 to 4W, and connecting capacitors 78 and 84 to the sources of transistors 28 and 52, respectively.

However, in the aforementioned alternative circuit configuration, a heavy load on, for example, output node 60 would cause not only a slow output swing on output node 60, but also a slow voltage swing at the gate of transistor 42, thereby decreasing the charging/discharging current available at output nodes 36, 38 and 40. Thus, heavy loading of one output node 60, 62 or 64 would decrease the output slew rate at all output nodes 36, 38, 40, 60, 62 and 64. Similarly, heavy loading of one output node 36, 38 or 40 would decrease the output slew rate at all output nodes 36, 38, 40, 60, 62 and 64.

In the circuit configuration shown in FIG. 1, the source of transistor 74 is effectively decoupled from output node 36 by the large resistance of resistor 76. Resistor 76 has the same voltage drop as across impedance 30, but with a much higher impedance. Thus, the signal supplied to the gate of transistor 66 during an output signal transition is not affected by heavy loading on output node 36. Similarly, the signal supplied to the gate of transistor 42 during an output signal transition is not affected by heavy loading on output node 60. The overall output slew rate of output stage 10 is thereby increased over that of the alternative configuration described above, without significantly increasing either the total transistor width utilized or the overall power dissipation.

Exemplary device values for the components of output stage 10 are listed below by reference numeral. While these values are presented for illustrative purposes, it will be understood that different circuit component values may be used without departing from the scope of the present invention.

| Transistor | Width (microns) |
|---|---|
| 12 | 32 |
| 14 | 32 |
| 16a | 32 |
| 26 | 32 |
| 28 | 48 |
| 42 | 96 |
| 50 | 32 |
| 52 | 48 |
| 66 | 96 |

| Resistor | Resistance (ohms) |
|---|---|
| 16c | 740 |
| 22 | 550 |
| 24 | 550 |
| 46 | 500 |
| 48 | 146 |
| 70 | 500 |
| 72 | 146 |
| 76 | 500 |
| 82 | 500 |

| Capacitor | Capacitance (femtofarads) |
|---|---|
| 78 | 400 |
| 84 | 400 |

| Voltage Source | Potential (volts) |
|---|---|
| 16b | 1.4 |
| 44 | 1.1 |
| $V_{DD}$ | 5.0 |
| $V_{SS}$ | 0 |

As previously stated, in one embodiment output stage 10 may be used as an output buffer for a logic circuit. In this embodiment, signals A1 and NA1 are complementary logic-level output signals from a logic circuit portion (not shown). Output stage 10, and particularly transistors 28 and 52, buffer the output signals and provide multi-level output signals at output nodes 36, 38, 40 60, 62 and 64.

Alternatively, output stage 10 may form an integral part of a logic circuit, as illustrated in FIG. 2. In this embodiment, transistors 12 and 14 form part of an AND gate 100. Transistors 12 and 14 have sources coupled to the drain of transistor 16a, as shown in FIG. 1. Two additional transistors 102 and 104 have sources coupled to the drain of transistor 12. Transistor 102 receives a logic-level signal B1 at its gate, while transistor 104 receives a complementary logic-level signal NB1 at its gate. The drains of transistors 102 and 104 are connected to nodes 18 and 20, respectively, and resistors 22 and 24, respectively. The remainder of the circuit is substantially as shown in FIG. 1.

In this embodiment, if signals A1 and B1 are HIGH, then node 18 is LOW and node 20 is HIGH. Thus, output nodes 60, 62 and 64 shown in FIG. 1 are HIGH, while output nodes 36, 38 and 40 are LOW. Conversely, if either A1 or B1 is LOW (NA1 or NB1 is HIGH), then output nodes 60, 62 and 64 are LOW, while output nodes 36, 38 and 40 are HIGH. AND gate 100 therefore functions as a standard AND gate, with multilevel complementary output signals at nodes 36, 38, 40, 60, 62 and 64.

In this embodiment, nodes 18 and 20 may be thought of as receiving a logic output signal from the logic portion of AND gate 100. Thus, nodes 18 and 20 form the beginning of an output stage portion of AND gate 100. Similarly, in FIG. 1, transistors 12, 14 and 16a may be considered either part of or separate from output stage 10, in that nodes 18 and 20 may be considered as the beginning of the output stage portion of the circuit.

AND gate 100 exhibits the high output slew rate characteristics described above in connection with FIG. 1. It will be understood that output stage 10 may also be implemented in other logic circuit configurations, such as an OR gate, an XOR gate, a register, a multiplexer or some other digital signal processing circuitry.

Although the present invention has been described as being implemented in an SCFL logic circuit, it will be understood that the present invention may be implemented in another logic design environment, such as ECL, utilizing either bipolar or field effect transistors. Thus, in the appended claims, the phrase "First terminal," when used in connection with a transistor, shall refer to the base or gate terminal of the transistor. Similarly, the phrases "second terminal" and "third terminal," when used in connection with a transistor, shall refer to the collector, drain, emitter or source terminal of the transistor. Furthermore, in the appended claims, the phrase "coupled to" shall refer to any electrical connection between two elements, whether a direct connection or through intervening active or passive circuit components.

Although the present invention and its advantages have been described in detail, it should be understood that various changes, substitutions, and alterations can be made therein without departing from the spirit and scope of the invention as defined by the appended claims.

I claim:

1. A logic circuit output stage comprising:

a first transistor having a first terminal operable to receive a first logic output signal, the first transistor further having a third terminal coupled to a first output node;

a second transistor having a first terminal coupled to the first terminal of the first transistor;

a third transistor having a first terminal operable to receive a second logic output signal, the third transistor further having a third terminal coupled to a second output node;

a variable current source having an input terminal coupled to a third terminal of the second transistor, the variable current source having an output terminal coupled to the second output node; and an impedance connected between the third terminal of the second transistor and the first output node;

wherein the second transistor is operable to provide a transient signal to the input terminal of the variable current source in response to a transition in the first logic output signal, and wherein the variable current source is operable to provide a temporary change in a current flowing through the second output node in response to the transient signal received from the second transistor.

2. The logic circuit output stage of claim 1, wherein the first transistor further comprises a second terminal coupled to a first reference voltage source.

3. The logic circuit output stage of claim 2, wherein the second transistor further comprises a second terminal coupled to the first reference voltage source.

4. The logic circuit output stage of claim 3, wherein the third transistor further comprises a second terminal coupled to the first reference voltage source.

5. The logic circuit output stage of claim 1, wherein the variable current source comprises:
   a fourth transistor having a first terminal coupled to the third terminal of the second transistor, the fourth transistor further having a second terminal coupled to the second output node;
   a bias voltage source; and
   a second impedance connected between the bias voltage source and the first terminal of the fourth transistor.

6. The logic circuit output stage of claim 1, further comprising a capacitor connected between the input terminal of the variable current source and the third terminal of the second transistor.

7. The logic circuit output stage of claim 1, further comprising:
   a fifth transistor having a first terminal coupled to the first terminal of the third transistor;
   a sixth transistor having a first terminal coupled to the third terminal of the fifth transistor, the sixth transistor further having a second terminal coupled to the first output node;
   a second impedance connected between the third terminal of the fifth transistor and the second output node.

8. The logic circuit output stage of claim 7, further comprising a second capacitor connected between the first terminal of the sixth transistor and the third terminal of the fifth transistor.

9. The logic circuit output stage of claim 1, wherein each transistor comprises a field effect transistor.

10. The logic circuit output stage of claim 1, further comprising:
    third and fourth output nodes, the fourth output node being coupled to the output terminal of the variable current source;
    a first output impedance connected between the third terminal of the first transistor and the first output node;
    a second output impedance connected between the first and third output nodes; and
    a third output impedance connected between the third and fourth output nodes.

11. The logic circuit output stage of claim 10, wherein each output impedance comprises a diode.

12. A logic circuit comprising:
    a plurality of logic transistors arranged to perform a logic function on a plurality of input signals and generate first and second logic output signals; and
    an output stage coupled to the logic transistors, the output stage having:
        a first transistor having a first terminal operable to receive the first logic output signal, the first transistor further having a third terminal coupled to a first output node;
        a second transistor having a first terminal coupled to the first terminal of the first transistor;
        a third transistor having a first terminal operable to receive the second logic output signal, the third transistor further having a third terminal coupled to a second output node;
        a fourth transistor having a first terminal coupled to a third terminal of the second transistor, the fourth transistor further having a second terminal coupled to the second output node; and
        an impedance connected between the third terminal of the second transistor and the first output node;
        wherein the second transistor is operable to provide a transient signal to the first terminal of the fourth transistor in response to a transition in the first logic output signal, and wherein the fourth transistor is operable to provide a temporary change in a current flowing through the second output node in response to the transient signal received from the second transistor.

13. The logic circuit of claim 12, wherein the output stage further comprises a capacitor connected between the first terminal of the fourth transistor and the third terminal of the second transistor.

14. The logic circuit of claim 12, wherein the output stage further comprises:
    a fifth transistor having a first terminal coupled to the first terminal of the third transistor;
    a sixth transistor having a first terminal coupled to the third terminal of the fifth transistor, the sixth transistor further having a second terminal coupled to the first output node; and
    a second impedance connected between the third terminal of the fifth transistor and the second output node.

15. The logic circuit of claim 12, wherein each transistor of the output stage comprises a field effect transistor.

16. The logic circuit of claim 12, wherein the output stage further comprises:
    third and fourth output nodes;
    a first output impedance connected between the third terminal of the first transistor and the first output node;
    a second output impedance connected between the first and third output nodes; and
    a third output impedance connected between the third and fourth output nodes.

17. The logic circuit of claim 16, wherein each output impedance comprises a diode.

18. A logic circuit output stage comprising:
    a first transistor having a first terminal coupled to a first signal source and operable to receive a first logic signal from the first signal source;
    a second transistor having a first terminal coupled to a second signal source, the second transistor further having a third terminal coupled to a third terminal of the first transistor and operable to receive a second logic signal from the second signal source;
    a third transistor having a first terminal coupled to a second terminal of the first transistor, the third transistor further having a third terminal coupled to a first output node;
    a fourth transistor having a first terminal coupled to the second terminal of the first transistor;
    a fifth transistor having a first terminal coupled to the second terminal of the second transistor, the fifth transistor further having a third terminal coupled to a second output node;

a sixth transistor having a first terminal coupled to a third terminal of the fourth transistor, the sixth transistor further having a second terminal coupled to the second output node;

an impedance connected between the third terminal of the fourth transistor and the first output node; and a capacitor connected between the first terminal of the sixth transistor and the third terminal of the fourth transistor wherein the fourth transistor is operable to provide a transient signal to the first terminal of the sixth transistor in response to a transition in the first logic signal, and wherein the sixth transistor is operable to provide a temporary change in a current flowing through the second output node in response to the transient signal received from the fourth transistor.

19. The logic circuit output stage of claim 18, further comprising a current source coupled to the third terminal of the first transistor and the third terminal of the second transistor, the current source being operable to conduct a constant current from the first and second transistors.

20. The logic circuit output stage of claim 18, further comprising:

a seventh transistor having a first terminal coupled to the first terminal of the fifth transistor;

an eighth transistor having a first terminal coupled to the third terminal of the seventh transistor, the eighth transistor further having a second terminal coupled to the first output node; and a second impedance connected between the third terminal of the seventh transistor and the second output node.

* * * * *